(12) United States Patent
Cho et al.

(10) Patent No.: US 12,279,505 B2
(45) Date of Patent: Apr. 15, 2025

(54) DISPLAY DEVICE AND TOUCH CONTROLLER

(71) Applicants: HKC CORPORATION LIMITED, Shenzhen (CN); CHUZHOU HKC OPTOELECTRONICS TECHNOLOGY CO., LTD., Chuzhou (CN)

(72) Inventors: En-Tsung Cho, Chongqing (CN); Chao Wei, Chongqing (CN)

(73) Assignees: HKC CORPORATION LIMITED, Shenzhen (CN); CHUZHOU HKC OPTOELECTRONICS TECHNOLOGY CO., LTD., Chuzhou (CN)

( * ) Notice: Subject to any disclaimer, the term of this patent is extended or adjusted under 35 U.S.C. 154(b) by 626 days.

(21) Appl. No.: 17/617,941

(22) PCT Filed: Jun. 5, 2020

(86) PCT No.: PCT/CN2020/094624
§ 371 (c)(1),
(2) Date: Dec. 10, 2021

(87) PCT Pub. No.: WO2020/248911
PCT Pub. Date: Dec. 17, 2020

(65) Prior Publication Data
US 2022/0310701 A1 Sep. 29, 2022

(30) Foreign Application Priority Data
Jun. 10, 2019 (CN) .......................... 201910497844.4

(51) Int. Cl.
*H10K 59/40* (2023.01)
*G02F 1/1333* (2006.01)
(Continued)

(52) U.S. Cl.
CPC ......... *H10K 59/40* (2023.02); *G02F 1/13338* (2013.01); *G02F 1/133512* (2013.01);
(Continued)

(58) Field of Classification Search
CPC ........ H10K 59/40; H10K 59/60; H10K 50/84; H10K 50/865; G02F 1/13338; G02F 1/133512; G06F 3/0416
See application file for complete search history.

(56) References Cited

U.S. PATENT DOCUMENTS

2022/0173174 A1* 6/2022 Hatsumi ................. G06F 21/32

FOREIGN PATENT DOCUMENTS

| CN | 101118915 A | 2/2008 |
|----|-------------|--------|
| CN | 102842027 A | 12/2012 |

(Continued)

OTHER PUBLICATIONS

Wei Bao, the ISA written comments, Sep. 2020, CN.
Wei Bao, the International Search Report, Sep. 2020, CN.

*Primary Examiner* — Timor Karimy (57) ABSTRACT

A display device and a touch controller are disclosed. The display device includes a protective screen, a display panel, a photosensitive element, and a light-concentrating element. The protective screen is arranged on a light-emitting surface of the display device. The photosensitive element is arranged between the display panel and the protective screen. The photosensitive element includes a photosensitive surface that receives light, and a light-concentrating element is arranged on the photosensitive surface of the photosensitive element.

15 Claims, 3 Drawing Sheets

(51) Int. Cl.
  *G02F 1/1335*  (2006.01)
  *G06F 3/041*  (2006.01)
  *H10K 50/84*  (2023.01)
  *H10K 50/86*  (2023.01)
  *H10K 59/60*  (2023.01)
(52) U.S. Cl.
  CPC ........... *G06F 3/0416* (2013.01); *H10K 50/84* (2023.02); *H10K 50/865* (2023.02); *H10K 59/60* (2023.02)

(56) References Cited

FOREIGN PATENT DOCUMENTS

| | | | |
|---|---|---|---|
| CN | 105304656 | A | 2/2016 |
| CN | 106022324 | * | 10/2016 |
| CN | 106022324 | A | 10/2016 |
| CN | 206058224 | U | 3/2017 |
| CN | 110471572 | A | 11/2019 |
| JP | 2019-025779 | * | 2/2019 |

* cited by examiner

DISPLAY DEVICE AND TOUCH CONTROLLER

CROSS-REFERENCE TO RELATED APPLICATIONS

This application is a United States national stage application of co-pending International Patent Application Number PCT/CN2020/094624, filed Jun. 5, 2020, which claims the priority to and benefit of Chinese patent application CN201910497844.4, entitled "Display Device and Touch Controller" and filed Jun. 10, 2019 with China National Intellectual Property Administration, the entire contents of which are incorporated herein by reference.

TECHNICAL FIELD

This application relates to the field of display technology, and more particularly relates to a display device and a touch controller.

BACKGROUND

The statements herein are intended for the mere purposes of providing background information related to the present application but don't necessarily constitute prior art.

With the development of multimedia technology, touch technology has become a popular technology in today's human-computer interaction. Optical touch technology is another mainstream touch technology besides resistive, capacitive and other touch technologies. The optical sensor responds quickly to fine and delicate actions and so can be used in conference venues, commercial exhibition venues, education and training venues, exhibitions, financial industries, military and many other industries. The principle of optical touch typically consists in the use a light source to illuminate the finger which will reflect the light, and the reflected light is received by a sensing element to identify the specific location of the touch.

However, the path for the reflected light to enter the photosensitive element is typically long hence a large loss, which easily causes the problem of inaccurate optical touch.

SUMMARY

It is therefore an objective of this application is to provide a display device and a touch controller.

The present application discloses a display device, including: a protective screen, a display panel, a photosensitive element, and a light-concentrating element. The protective screen is arranged on the light-emitting surface of the display device, and the photosensitive element is arranged between the display panel and the protective screen. The photosensitive element includes a photosensitive surface that receives light, and the light concentrating element is arranged on the photosensitive surface of the photosensitive element.

The present application further discloses a display device, including: a protective screen arranged on the light-emitting surface of the display device, a display panel arranged opposite to the protective screen, and a photosensitive element arranged between the display panel and the protective screen. The photosensitive element includes a photosensitive surface that receives light, and a light concentrating element is arranged on the photosensitive surface. The photosensitive element includes a first electrode layer, a first doped layer, an intrinsic layer, a second doped layer, and a second electrode layer sequentially formed in the direction of the protective screen. A protective layer is arranged between the second doped layer and the second electrode layer and defines a via hole, and the second electrode layer is connected to the second doped layer through the via hole. There may be provided a plurality of such photosensitive elements, and an isolation layer may be disposed between every two adjacent photosensitive elements, where the isolation layer has a greater thickness than the that of the photosensitive element. The isolation layer includes a recessed area formed around the photosensitive element, and the thickness of the recessed area gradually decreases in the direction of nearing the photosensitive element. The second electrode layer is formed above the isolation layer, and the light-concentrating element is disposed on the side of the second electrode layer adjacent to the protective screen and corresponding to the recessed area. The display device further includes a readout active switch connected to the photosensitive element in one-to-one correspondence, where the readout active switch includes a transparent electrode layer formed above the readout active switch. The transparent electrode layer and the first electrode layer are formed in the same manufacturing procedure.

The application further discloses a touch controller, including a protective screen, a backlight, and a photosensitive element. The protective screen is arranged on a touch surface of the touch controller. The photosensitive element is arranged between the display panel and the protective screen. The photosensitive element includes a photosensitive surface that receives light. A light-concentrating element is arranged on the photosensitive surface of the photosensitive element.

Compared with the exemplary solution of arranging the photosensitive element on the same layer as the active switch, the photosensitive element of the present application is provided with a light-concentrating element on the photosensitive surface, so that part of the light that would otherwise be unable to reach the photosensitive element (e.g., the reflected light from a touching finger) converge toward the photosensitive surface of the photosensitive element, which can increase the amount of light reaching the photosensitive surface of the photosensitive element, thereby increasing the intensity of the created photosensitive current, thereby improving the accuracy of finger positioning. When the photosensitive element is used for fingerprint recognition, increasing the amount of light reaching the photosensitive surface of the photosensitive element can improve the clarity of the fingerprint pattern formed, thereby improving the accuracy of fingerprint recognition. Moreover, the photosensitive element is arranged between the display panel and the protective screen, which makes the light propagation path between the protective screen and the photosensitive element shorter, and the number of glass layers or film structures that the finger reflected light or the like light to be measured needs to pass through to reach the photosensitive element is reduced, so that the possibility that the finger reflected light will be received by the photosensitive element increases, improving the photosensitivity of the photosensitive element. The arrangement of the photosensitive element close to the protective screen in combination with the light-concentrating element jointly enhance the ability of the photosensitive element to obtain the light to be measured, thereby improving the precision of photosensitivity and reducing the possibility of misjudgment.

BRIEF DESCRIPTION OF DRAWINGS

The accompanying drawings are used to provide a further understanding of the embodiments according to the present application, and constitute a part of the specification. They are used to illustrate the embodiments according to the present application, and explain the principle of the present application in conjunction with the text description. Apparently, the drawings in the following description merely represent some embodiments of the present disclosure, and for those having ordinary skill in the art, other drawings may also be obtained based on these drawings without investing creative efforts. A brief description of the accompanying drawings is provided as follows.

DETAILED DESCRIPTION OF EMBODIMENTS

It should be understood that the terms used herein, the specific structures and function details disclosed herein are intended for the mere purposes of describing specific embodiments and are representative. However, this application may be implemented in many alternative forms and should not be construed as being limited to the embodiments set forth herein.

As used herein, terms "first", "second", or the like are merely used for illustrative purposes, and shall not be construed as indicating relative importance or implicitly indicating the number of technical features specified. Thus, unless otherwise specified, the features defined by "first" and "second" may explicitly or implicitly include one or more of such features. Terms "multiple", "a plurality of", and the like mean two or more. Term "comprising", "including", and any variants thereof mean non-exclusive inclusion, so that one or more other features, integers, steps, operations, units, components, and/or combinations thereof may be present or added.

In addition, terms "center", "transverse", "up", "down", "left", "right", "vertical", "horizontal", "top", "bottom", "inside", "outside", or the like are used to indicate orientational or relative positional relationships based on those illustrated in the drawings. They are merely intended for simplifying the description of the present disclosure, rather than indicating or implying that the device or element referred to must have a particular orientation or be constructed and operate in a particular orientation. Therefore, these terms are not to be construed as restricting the present disclosure.

Furthermore, as used herein, terms "installed on", "mounted on", "connected to", "coupled to", "connected with", and "coupled with" should be understood in a broad sense unless otherwise specified and defined. For example, they may indicate a fixed connection, a detachable connection, or an integral connection. They may denote a mechanical connection, or an electrical connection. They may denote a direct connection, a connection through an intermediate, or an internal connection between two elements. For those of ordinary skill in the art, the specific meanings of the above terms as used in the present application can be understood depending on specific contexts.

Hereinafter this application will be described in further detail with reference to the accompanying drawings and some optional embodiments.

The exemplary photosensitive element 300 is generally arranged on the same layer as the active switch of the array substrate. However, such an arrangement makes the distance between the photosensitive element 300 and the protective screen 100 relatively long. Therefore, when the photosensitive element 300 is used for the touch function, when a finger touches the protective screen 100 of the display device, diffuse reflection will occur due to the presence of the finger. After the light to be measured is reflected and propagated over a relatively large distance, the light at a large angle cannot enter the photosensitive element 300, which may cause the problem of inaccurate recognition of the touch position. In view of this problem, the inventor of the present application made improvements and obtained the following solution.

Figure 1:
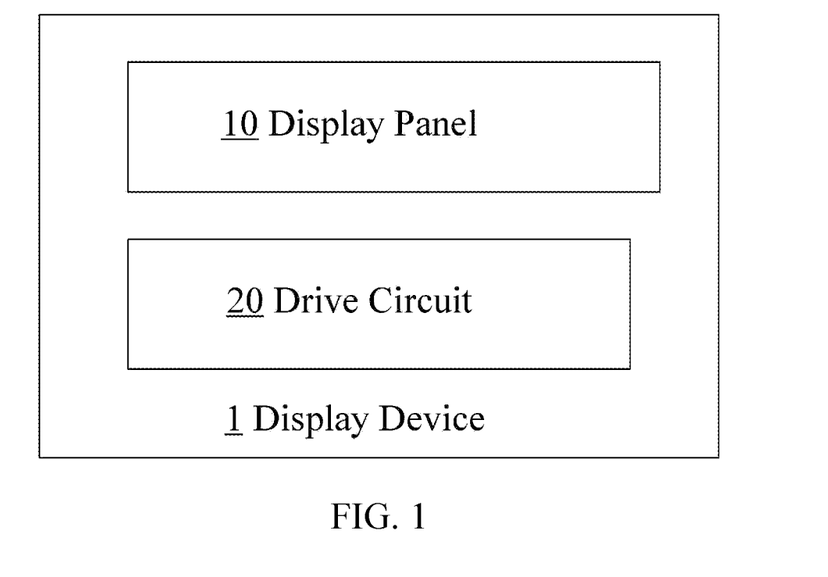
FIG. 1 shows a schematic diagram of a display device according an embodiment of the present application.
Figure 2:
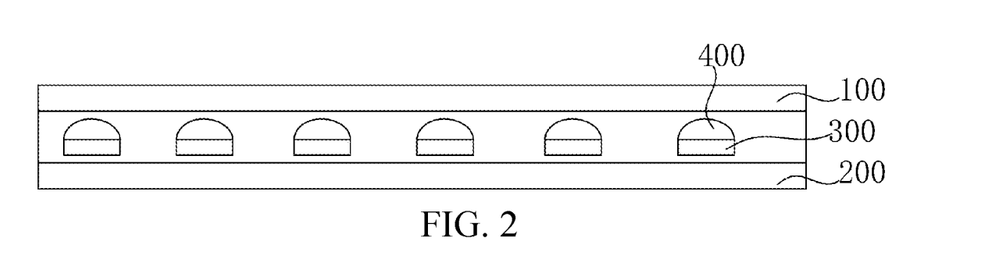
FIG. 2 shows a schematic diagram of a display device according to an embodiment of the present application.

As illustrated in FIGS. 1 to 2, the present application discloses a display device, which includes a display device 10 and a driving circuit 20 that drives the display device 10. The display device 10 includes: a protective screen 100, a display panel 200, a photosensitive element 300, and a light-concentrating element 400. The protective screen 100 is arranged on a light-emitting surface of the display device 10, and the photosensitive element 300 is arranged between the display panel 200 and the protective screen 100. The photosensitive element 300 includes a photosensitive surface that receives light. The light-concentrating element 400 is arranged on the photosensitive surface of the photosensitive element 300.

Compared with the exemplary solution of arranging the photosensitive element 300 on the same layer as the active switch, the photosensitive element 300 of the present application is provided with a light-concentrating element 400 on the photosensitive surface, so that part of the light that would otherwise be unable to reach the photosensitive element 300 (e.g., the reflected light from a touching finger) converge toward the photosensitive surface of the photosensitive element 300, which can increase the amount of light reaching the photosensitive surface of the photosensitive element 300, thereby increasing the intensity of the created photosensitive current, thereby improving the accuracy of finger positioning. When the photosensitive element 300 is used for fingerprint recognition, increasing the amount of light reaching the photosensitive surface of the photosensitive element 300 can improve the clarity of the fingerprint pattern formed, thereby improving the accuracy of fingerprint recognition. Moreover, the photosensitive element 300 is arranged between the display panel 200 and the protective screen 100, which makes the light propagation path between the protective screen 100 and the photosensitive element 300 shorter, and the number of glass layers or film structures that the finger reflected light or the like light to be measured needs to pass through to reach the photosensitive element 300 is reduced, so that the possibility that the finger reflected light will be received by the photosensitive element 300 increases, improving the photosensitivity of the photosensitive element 300. The arrangement of the photosensitive element 300 close to the protective screen 100 in combination with the light-concentrating element 400 jointly enhance the ability of the photosensitive element 300 to obtain the light to be measured, thereby improving the precision of photosensitivity and reducing the possibility of misjudgment.

Of course, the display panel 200 in this application may be an OELD (Organic Light-Emitting Diode) panel, or a Micro-LED (Micro Light Emitting Diode, micro light-emitting diode) panel, where the display panel 200 may include am organic active light-emitting pixel matrix or micro light-emitting diode pixel matrix. The display device 10 includes a front plate, which is located between the active light-emitting display panel 210 and the protective screen 100, or between the micro light-emitting diode pixel matrix-220 and the protective screen 100. The photosensitive element 300 is arranged on the front plate. Such an arrangement can make the photosensitive element 300 and the light-concentrating element 400 be placed on the front panel as close to the protective screen 100 as possible, which is beneficial to shorten the propagation path of the light to be detected, thereby increasing the possibility of the light to be detected being received by the photosensitive element 300, thus improving the sensitivity of the photosensitive element 300.

Specifically, the organic active light-emitting pixel matrix may include a white light-emitting diode, or the microlight-emitting diode pixel matrix may include a white light-emitting diode. The photosensitive element 300 is arranged corresponding to the white light-emitting diode. The white light-emitting diode is beneficial to improve the brightness of the display device 10. The photosensitive element 300 is arranged at a position corresponding to the white light-emitting diode. The various film layers of the photosensitive element 300 have a weak impact on the white light, which can avoid the influence of the photosensitive element 300 on the light transmittance of the red, green and blue light-emitting diodes. Furthermore, the photosensitive element 300 is not arranged on the red light emitting diode, the green light emitting diode, and the blue light emitting diode, thus avoiding the problems that the the light transmittance of the corresponding light-emitting diode will be affected so that the light transmittances of the RGB pixels will be rendered inconsistent resulting in color deviation and affecting the display effect, because the photosensitive element 300 is disposed on one of the red, green, or blue light-emitting diodes. According, the present applications retains a higher display effect of the display device 10.

Figure 3:
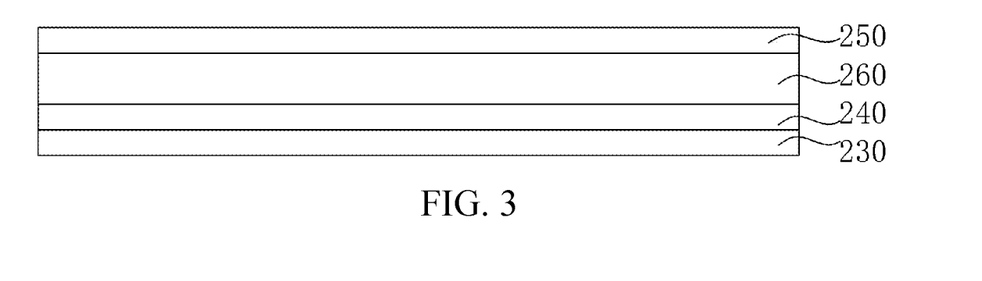
FIG. 3 shows a schematic diagram of a display panel according to an embodiment of the present application.

In addition, the display panel 200 in the present application may also be a pixel matrix of a TFT-LCD (Thin Film Transistor-Liquid Crystal Display) display device 10, as illustrated in FIG. 3, where the display panel 200 includes a backlight module 230, a first substrate 240, a second substrate 250 disposed opposite to the first substrate 240, and a liquid crystal layer 260 disposed between the first substrate 240 and the second substrate 250. An active switch array is arranged on the first substrate 240, and the photosensitive element 300 is arranged between the second substrate 250 and the protective screen 100. When the display panel 200 in the present application is a TFT-LCD pixel array, because the film layers of the TFT-LCD are thicker, if the photosensitive element 300 is arranged on the first substrate (array substrate), the light to be detected will travel even farther resulting in even greater loss. Thus, in the present application, the photosensitive element 300 is arranged between the second substrate 250 and the protective screen 100, so as to be closer to the protective screen 100, and the propagation path of the light to be detected reflected in touch is shorter, hence better recognition effect.

Of course, in the present application, the second substrate 250 may also be arranged on the side of the first substrate close to the protective screen 100, and the photosensitive element 300 is disposed on the second substrate 250, which is also possible.

The second substrate includes pixel units. The pixel units include a plurality of red sub-pixels, a plurality of blue sub-pixels, a plurality of green sub-pixels, and a plurality of white sub-pixels. The photosensitive element 300 is disposed at a position corresponding to the white sub-pixel. The white sub-pixel includes a pixel electrode and a white color filter corresponding to the pixel electrode. The white color filter has a high light transmittance, which is beneficial to improve the brightness of the display device 10, and can prevent the photosensitive element 300 from affecting the light transmittance of the red sub-pixel, the green sub-pixel, and the blue sub-pixel, thus avoiding the problems that the light transmittance of the corresponding light-emitting diode is affected and so the light transmittances of the RGB pixels will be rendered inconsistent, resulting in color deviation and affecting the display effect, because the photosensitive elements 300 is disposed on one of the red, green, or blue light-emitting diode. Accordingly, the present application is able to achieve a higher display effect of the display device 10.

Specifically, the thickness of the protective screen 100 is between 0.07-0.5 mm. The thinner the thickness of the protective screen 100, the shorter the distance that the emitted light passes when entering the photosensitive element 300, and the lower the loss. Furthermore, when the path is shorter, the light to be detected at the corresponding position can also be received by the photosensitive element 300 at the corresponding position, which is closer to the reflected light, thereby effectively increasing the amount of light collected by the light-concentrating element 400. Within this range, the thickness of the protective screen 100 is not too thin to protect other parts of the display device 10, and it is also not so thick that the light to be detected has a large transmission loss thus reducing the light transmittance.

As illustrated in FIGS. 4 to 8, there may be provided a plurality of photosensitive elements 300, and an isolation layer 500 is disposed between every two adjacent photosensitive elements 300, where the isolation layer 500 has a greater thickness than that of the photosensitive element 300. The isolation layer 500 includes a recessed area formed around the photosensitive element 300, and the thickness of the recessed area gradually decreases in the direction of nearing the photosensitive element 300.

Figure 4:
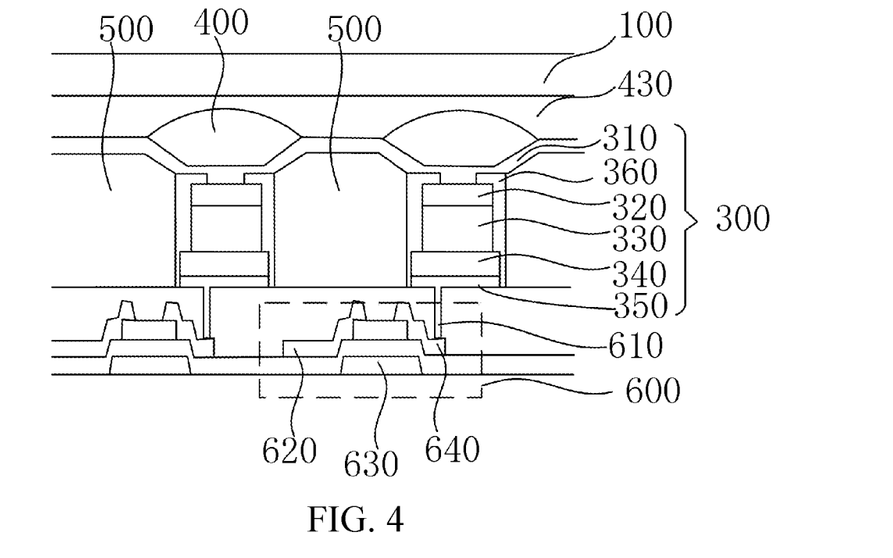
FIG. 4 shows a schematic diagram of a display device according to an embodiment of the present application.
Figure 6:
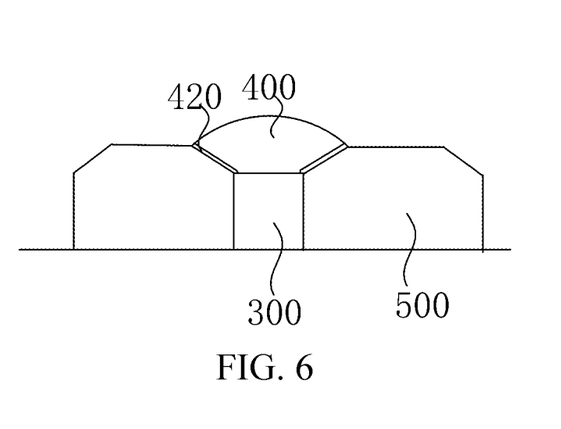
FIG. 6 shows a schematic diagram of another isolation layer according to an embodiment of the present application.
Figure 7:
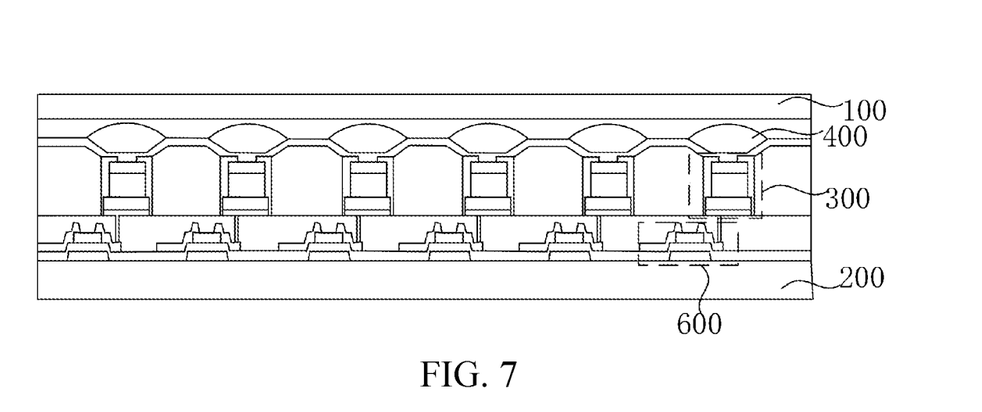
FIG. 7 shows a schematic diagram of another display device according to an embodiment of the present application.
Figure 8:
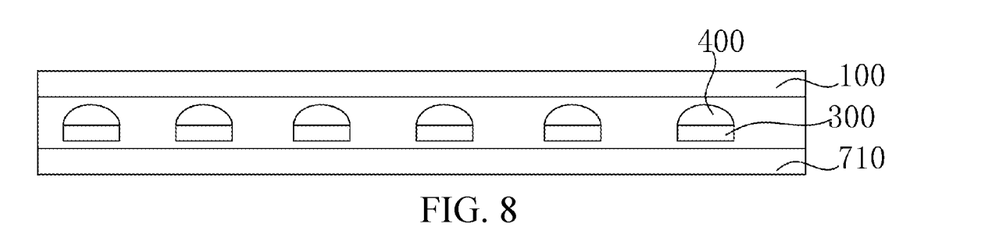
FIG. 8 shows a schematic diagram of a touch controller according to an embodiment of the present application.

Correspondingly, in the step of forming the isolation layer 500, a half-tone mask is used. The half-tone mask includes three parts, namely: a light-transmitting area 510, a light-shielding area 530, and a semi-transmissive area 520. The light-shielding area 510 forms the isolation layer 500 with the largest thickness. The light-transmitting area 530 does not form the isolation layer 500. The semi-transmissive area 520 forms a recessed area with a gradually changing thickness. The light transmittance of the recessed area is gradually changed to form an arc-shaped recessed area, the recessed area corresponds to the shape of the light-concentrating element 400, and is used to protect the light-concentrating element 400. As illustrated in FIGS. 4 and 6, after the isolation layer 500 is formed, the photosensitive element 300 will be formed in the corresponding light-transmitting area, and the light-concentrating element 400 is formed above the photosensitive element 300 and the recessed area, so that the light-concentrating element 400 formed in the recessed area is in the shape of a convex lens 410 to enhance the light concentrating effect. The diameter of the convex lens 410 may be set to 10-75 um, and the corresponding range of light transmittance is 60%-90%. The diameter of the convex lens cannot be set too large or too small. The area where a photosensitive element collects light is fixed. If it is too large, it will not collect more light. If it is too small, it will be unable to collect all the light in the light-collecting area. Therefore, it is only necessary to collect and transmit the light from the corresponding area of the corresponding photosensitive element 300 to the photosensitive element 300, and the light transmittance is relatively high to prevent excessive light attenuation.

In particular, an encapsulation layer 430 may be arranged between the plurality of convex lenses 410 and the protective screen 100 to ensure that it is flat above the convex lens 410.

Of course, the light-concentrating element 400 in the present application may be a convex lens, a micro lens, etc., or may be other optical elements that can concentrate light shone in different angles, as long as it is applicable.

Figure 5:
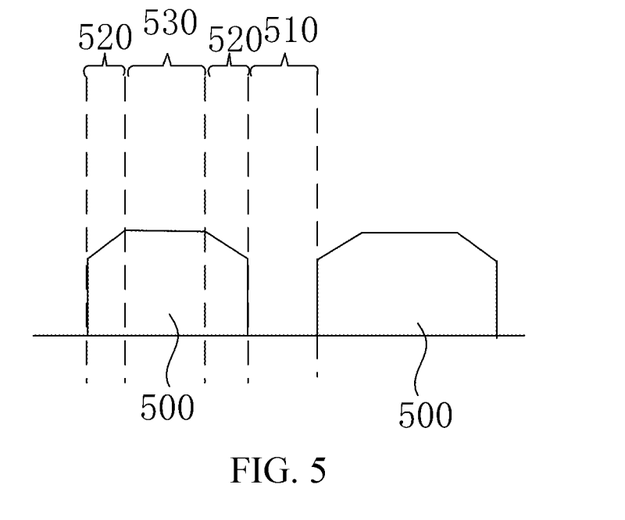
FIG. 5 shows a schematic diagram of an isolation layer according to an embodiment of the present application.

As illustrated in FIG. 5, a light shielding layer 420 may further be disposed between the isolation layer 500 in the recessed area and the light concentrating element 400 to prevent the light emitted by the display panel 200 from passing through the light concentrating element 400 causing refraction or reflection, thereby affecting the display effect.

In particular, the photosensitive element 300 may include a first electrode layer 350, a first doped layer 340, an intrinsic layer 330, a second doped layer 320, and a second electrode layer 310 sequentially formed in the direction of the protective screen 100. The light-concentrating element 400 is disposed on the second electrode layer 310. A protective layer 360 is disposed between the second doped layer 340 and the second electrode layer 310, and defines a via hole, and the second electrode layer 310 is coupled to the second doped layer 320 through the via hole. The intrinsic layer 330 has a greater thickness than that of the second doped layer 340 and also greater than the thickness of the second doped layer 320. The first doped layer 340 is an N-type doped layer, the second doped layer 320 is a P-type doped layer, the first electrode layer 350 is an anode, and the second electrode layer is a cathode.

The photosensitive element 300 further includes a separation layer disposed between the P-type doped layer 321 and the N-type doped layer 341, and the separation layer covers the sidewall of the N-type doped layer 341. The separation layer is used to isolate the electrical properties of the N-type doped layer 341 and the P-type doped layer 321, preventing the N-type doped layer 341 and the P-type doped layer 321 from being electrically connected during the formation process.

The corresponding steps of forming the above photosensitive element 300 with a separation layer include: forming an N-type doped layer 341; forming an intrinsic layer 331 of the same size as the N-type doped layer 341; forming a separation layer on the intrinsic layer 330; defining an opening in the separation layer, and forming a P-type doped layer 321 on the separation layer and connecting the P-type doped layer 321 to the intrinsic layer 330 through the opening.

Of course, the separation layer may additionally be formed on the N-type doped layer 341, and an opening may be defined in the separation layer, so that the intrinsic layer 330 can be formed on the separation layer and coupled to the N-type doped layer 341 through the opening.

In particular, the display device 10 may further include a readout active switch 600 connected to the photosensitive element 300 in one-to-one correspondence, where the readout active switch 600 includes a transparent electrode layer 610 formed on the readout active switch 600. The transparent electrode layer 610 and the first electrode layer 350 are formed in the same manufacturing procedure. The readout active switch 600 includes a gate 630, a source 640, and a drain 620, where the source 640 is connected to the transparent electrode layer 610. The display device 10 further includes a recognition circuit, and the gate 630 and the drain 650-620 are each connected to the recognition circuit. The transparent electrode layer 610 is connected to the first electrode layer 350. The readout active switch 600 is used to identify the photosensitive current generated after the photosensitive element 300 collects light with different strengths. When the gate of the active read switch 600 is turned on, the active read switch 600 transmits the photosensitive current to the corresponding photosensitive current recognition chip for data processing.

As illustrated in FIG. 9, as another embodiment of the present application, a touch controller is disclosed, including a protective screen 100, a backlight 710, and a photosensitive element 300. The protective screen 100 is arranged on the touch surface of the touch controller. The photosensitive element 300 is disposed between the display panel 200 and the protective screen 100. The photosensitive element 300 includes a photosensitive surface that receives light. A condensing element 400 is disposed on the photosensitive surface of the photosensitive element 300. The structure of the photosensitive element 300 and the structure of the isolation layer 500 are as described above, and will not be repeated here again. The touch controller in this embodiment can be used for fingerprint recognition or as a touch module, which may be modified and installed on the display device 10 for use.

The foregoing description is merely a further detailed description of the present application made with reference to some specific illustrative embodiments, and the specific implementations of the present application will not be construed to be limited to these illustrative embodiments. For those having ordinary skill in the technical field to which this application pertains, numerous simple deductions or substitutions may be made without departing from the concept of this application, which shall all be regarded as falling in the scope of protection of this application.

What is claimed is:

1. A display device, comprising:
   a protective screen, disposed on a light-emitting surface of the display device;
   a display panel, disposed opposite to the protective screen; and
   a photosensitive element, disposed between the display panel and the protective screen;
   wherein the photosensitive element comprises a photosensitive surface configured to receive light, and a light-concentrating element is disposed on the photosensitive surface;
   wherein the photosensitive element comprises a first electrode layer, a first doped layer, an intrinsic layer, a second doped layer, and a second electrode layer, which are sequentially formed in the direction of the protective screen;
   wherein a protective layer is disposed between the second doped layer and the second electrode layer and defines a via hole, and wherein the second electrode layer is coupled to the second doped layer through the via hole;
   wherein there are disposed a plurality of said photosensitive elements, and an isolation layer is disposed between every two adjacent photosensitive elements, wherein the isolation layer has a greater thickness than that of the photosensitive element; wherein the isolation layer comprises a recessed area that is formed around the photosensitive element and that has a gradually decreasing thickness in the direction of nearing the photosensitive element; and wherein the second electrode layer is formed on the isolation layer, and the light-concentrating element is disposed on the side of the second electrode layer adjacent to the protective screen and is disposed corresponding to the recessed area.

2. The display device as recited in claim 1, wherein the display panel comprises an organic active light-emitting pixel matrix;

wherein the display device comprises a front plate disposed between the organic active light-emitting pixel matrix and the protective screen, and wherein the photosensitive element is disposed on the front plate.

3. The display device as recited in claim 2, wherein the organic active light-emitting pixel matrix comprises a white light-emitting diode, and the photosensitive element is arranged corresponding to the respective white light-emitting diode.

4. The display device as recited in claim 1, wherein the display panel comprises a micro light-emitting diode pixel matrix;

wherein the display device includes a front plate disposed between the micro light-emitting diode pixel matrix and the protective screen, and wherein the photosensitive element is disposed on the front plate.

5. The display device as recited in claim 4, wherein the micro light-emitting diode pixel matrix comprises a white light emitting diode, and the photosensitive element is arranged corresponding to the respective white light emitting diode.

6. The display device as recited in claim 1, further comprising a readout active switch connected to the photosensitive element in one-to-one correspondence, wherein the readout active switch comprises a transparent electrode layer formed on the active switch;

wherein the transparent electrode layer and the first electrode layer are formed in the same manufacturing procedure.

7. The display device as recited in claim 1, wherein the protective screen has a thickness that lies in the range of 0.07-0.5 mm.

8. The display device as recited in claim 1, wherein the display panel comprises:

a first substrate, on which an active switch array is disposed;

a second substrate, disposed opposite to the first substrate; and a liquid crystal layer, disposed between the first substrate and the second substrate;

wherein the display device further includes a backlight module configured to provide backlight for the display panel;

wherein the photosensitive element is disposed between the second substrate and the protective screen.

9. The display device as recited in claim 8, wherein the second substrate comprises a plurality of pixel units, and the plurality of pixel units comprises a plurality of red sub-pixels, a plurality of blue sub-pixels, a plurality of green sub-pixels, and a plurality of white sub-pixels, wherein the photosensitive element is arranged corresponding to the respective white sub-pixel.

10. The display device as recited in claim 1, wherein the light-concentrating element is a convex lens or a micro lens.

11. The display device as claimed in claim 10, wherein the convex lens has a diameter that lies in the range of 10-75 um, with a corresponding light transmittance that lies in the range of 60%-90%.

12. The display device as recited in claim 1, wherein the isolation layer is formed using a half-tone mask, which comprises three parts, including a light-transmitting area, a light-shielding area, and a semi-transmissive area, wherein the light-shielding area is configured to form the isolation layer with the largest thickness, the light-transmitting area does not form the isolation layer, and the semi-transmissive area is configured to form a recessed area with a gradually changing thickness and a corresponding gradually changed light transmittance, thus forming an arc-shaped recessed area.

13. The display device as recited in claim 1, wherein an encapsulation layer is disposed between the plurality of the light-concentrating elements and the protective screen.

14. The display device as recited in claim 1, wherein a light shielding layer is disposed between the isolation layer and the light-concentrating element, and the light shielding layer is disposed corresponding to the recessed area.

15. A display device, comprising:

a protective screen, disposed on a light-emitting surface of the display device;

a display panel, disposed opposite to the protective screen; and a photosensitive element, disposed between the display panel and the protective screen;

wherein the photosensitive element comprises a photosensitive surface configured to receive light, and a light-concentrating element is disposed on the photosensitive surface;

wherein the photosensitive element comprises a first electrode layer, a first doped layer, an intrinsic layer, a second doped layer, and a second electrode layer, which are sequentially formed in the direction of the protective screen;

wherein a protective layer is disposed between the second doped layer and the second electrode layer and defines a via hole, and wherein the second electrode layer is coupled to the second doped layer through the via hole;

wherein there are disposed a plurality of said photosensitive elements, and an isolation layer is arranged between every two adjacent photosensitive elements, wherein the isolation layer has a greater thickness than that of the photosensitive element; wherein the isolation layer comprises a recessed area that is formed around the photosensitive element and that has a gradually decreasing thickness in the direction of nearing the photosensitive element; and wherein the second electrode layer is formed on the isolation layer, and the light-concentrating element is disposed on the side of the second electrode layer adjacent to the protective screen and is disposed corresponding to the recessed area;

wherein the display device further comprises a readout active switch connected to the photosensitive element in one-to-one correspondence, wherein the readout active switch comprises a transparent electrode layer formed on the readout active switch;

wherein the transparent electrode layer and the first electrode layer are formed in the same manufacturing procedure.

* * * * *